US012563907B2

(12) United States Patent
Jiao et al.

(10) Patent No.: US 12,563,907 B2
(45) Date of Patent: Feb. 24, 2026

(54) DISPLAY PANEL AND MANUFACTURE METHOD THEREFOR

(71) Applicant: BOE TECHNOLOGY GROUP CO., LTD., Beijing (CN)

(72) Inventors: Zhiqiang Jiao, Beijing (CN); Lu Wang, Beijing (CN); Qingyu Huang, Beijing (CN); Peng Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 592 days.

(21) Appl. No.: 18/041,991

(22) PCT Filed: Mar. 4, 2022

(86) PCT No.: PCT/CN2022/079209
§ 371 (c)(1),
(2) Date: Feb. 16, 2023

(87) PCT Pub. No.: WO2022/267533
PCT Pub. Date: Dec. 29, 2022

(65) Prior Publication Data
US 2023/0329041 A1 Oct. 12, 2023

(30) Foreign Application Priority Data

Jun. 25, 2021 (CN) .......................... 202110715837.4

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/38* (2023.02);
(Continued)

(58) Field of Classification Search
CPC .. H10K 59/122; H10K 59/1201; H10K 59/38; H10K 59/873; H10K 59/877;
(Continued)

(56) References Cited

U.S. PATENT DOCUMENTS 10,163,975 B2 12/2018 Choi
10,211,264 B2 2/2019 Lee et al.
(Continued)

FOREIGN PATENT DOCUMENTS

CN 1787226 A 6/2006
CN 102738367 A 10/2012
(Continued)

OTHER PUBLICATIONS

International Search Report and Written Opinion dated May 27, 2022, for corresponding PCT Application No. PCT/CN2022/079209.

*Primary Examiner* — James R Greece
*Assistant Examiner* — Jose M Diaz
(74) *Attorney, Agent, or Firm* — Kinney & Lange, P.A.

(57) ABSTRACT

The present disclosure provides a display panel comprising a bottom emitting type array substrate and a wavelength converting unit, wherein the wavelength converting unit is in contact with a transparent substrate layer of the array substrate, and the transparent substrate layer has a thickness of 5 μm or less. The present disclosure also provides a method for manufacturing the display panel by using a subtractive manufacture process.

20 Claims, 6 Drawing Sheets

(51) Int. Cl.

| | | |
|---|---|---|
| *H10K 59/38* | (2023.01) | |
| *H10K 59/80* | (2023.01) | |
| *H10K 71/80* | (2023.01) | |
| *H10K 102/00* | (2023.01) | |

(52) U.S. Cl.
CPC ........... *H10K 59/873* (2023.02); *H10K 71/80* (2023.02); *H10K 59/877* (2023.02); *H10K 59/8792* (2023.02); *H10K 2102/351* (2023.02)

(58) Field of Classification Search
CPC .... H10K 59/8792; H10K 59/32; H10K 59/35; H10K 71/80; H10K 2102/351; H10K 2102/3023; H10K 77/10
See application file for complete search history.

(56) References Cited

U.S. PATENT DOCUMENTS

| | | | |
|---|---|---|---|
| 10,797,115 | B2 | 10/2020 | Lee |
| 10,950,822 | B2 | 3/2021 | Shin et al. |
| 2006/0152151 | A1 | 7/2006 | Seo |
| 2012/0248469 | A1 | 10/2012 | Choi |
| 2016/0163769 | A1 | 6/2016 | Lee et al. |
| 2017/0148772 | A1 | 5/2017 | Choi |
| 2018/0190751 | A1 | 7/2018 | Lee et al. |
| 2019/0058013 | A1 | 2/2019 | Lee |
| 2019/0198819 | A1 | 6/2019 | Shin et al. |
| 2021/0384442 | A1* | 12/2021 | Watabe ................ H10K 59/876 |
| 2023/0117381 | A1 | 4/2023 | Geng et al. |

FOREIGN PATENT DOCUMENTS

| | | | |
|---|---|---|---|
| CN | 105576004 | A | 5/2016 |
| CN | 105679791 | A | 6/2016 |
| CN | 107004699 | A | 8/2017 |
| CN | 107293555 | A | 10/2017 |
| CN | 108735792 | A | 11/2018 |
| CN | 109119453 | A | 1/2019 |
| CN | 109411512 | A | 3/2019 |
| CN | 110010658 | A | 7/2019 |
| CN | 111584568 | A | 8/2020 |
| CN | 111668249 | A | 9/2020 |
| EP | 3086373 | A2 | 10/2016 |
| EP | 3236502 | A1 | 10/2017 |
| JP | 2008270061 | A | 11/2008 |
| KR | 20160013443 | A | 2/2016 |
| WO | 2019230328 | A1 | 12/2019 |

* cited by examiner (a)

(b)

(c)

(a)

(b)

(a)

(b) (c) (d) (e)

(f) (g) (h) (i) (j)

DISPLAY PANEL AND MANUFACTURE METHOD THEREFOR

CROSS-REFERENCE TO RELATED APPLICATION(S)

This application is a National Stage Application of International Application No. PCT/CN2022/079209, filed on Mar. 4, 2022, entitled "DISPLAY PANEL AND MANUFACTURE METHOD THEREFOR", which claims priority to Chinese Patent Application No. 202110715837.4, filed on Jun. 25, 2021, the entire content of which are incorporated herein in their entireties by reference.

TECHNICAL FIELD

The present disclosure relates to the technical field of display, and particularly to a display panel and a manufacture method therefor.

BACKGROUND

Organic light emitting display (OLED) as a mainstream display technology has occupied the market of mobile display, and also attracts significant interest of the manufactures in display applications such as TV. In view of how to display colors, the technical routes of OLED are mainly divided into two types. One is to use organic light emitting materials which emit different colors respectively (such as red light emitting material, green light emitting material and blue light emitting material) to form sub-pixels with different colors, which is called the RGB type. The RGB type has a high color gamut, and has occupied the market of small size applications. However, it has not been scaled up to a large area because it was restricted by the fine metal mask (FMM) process. Although the RGB type where RGB OLEDs are ink jet printed is a potential technology for large scale OLEDs, the color gamut is not high enough due to the restriction in the research and development of the OLED material in a solution process. The other is to achieve the color display by using a single color OLED as a backlight emitting unit in combination with color films, which is called the backlight-color film type. The process in which a white backlight is combined with color films is one of the mainstream technologies for large scale OLED because it may be achieved by evaporation on the entire surface with an open mask. In the white backlight-color film technology, the color films function to filter off any light with a wavelength other than that for the desired color from the white light. The color gamut of the color films directly restricts the color gamut range of the large scale OLED product.

In addition to the mode in which the backlight with an unwanted wavelength is filtered off, a technology where a wavelength converting component is used to change the color of the light emitted by an OLED to achieve the color display has emerged. For example, a technology combining an OLED having a blue light emitting layer with quantum dots (QDs) has been proposed in the related art, where the OLED having a blue light emitting layer is used as a light source, and QDs are used cooperatively to down-convert blue light into red light and green light, thereby achieving the color display. Such a technology is called the QD-OLED.

The development of the display panel comprising a wavelength converting component still faces many practical technical challenges. There is still a need for improving the display panel comprising a wavelength converting component, in particular a QD conversion layer.

SUMMARY

In an aspect, the present disclosure provides a display panel comprising:

a transparent substrate layer;

a thin film transistor layer on a side of the transparent substrate layer;

a first pixel defining layer on a side of the thin film transistor layer away from the transparent substrate layer and having a plurality of first openings;

a plurality of light emitting devices arranged in an array in the plurality of first openings and on a side of the thin film transistor layer away from the transparent substrate layer, wherein the light emitting devices are bottom emitting type light emitting devices;

a second pixel defining layer on a side of the transparent substrate layer away from the thin film transistor layer and having a plurality of second openings; and a wavelength converting layer having a plurality of wavelength converting units, each of the wavelength converting units being disposed in one of the second openings and in contact with the transparent substrate layer;

wherein the transparent substrate layer has a thickness less than or equal to 5 μm.

Optionally, the transparent substrate layer comprises a first organic layer, wherein the first organic layer is in contact with the wavelength converting unit and comprises a first organic material.

Optionally, the second pixel defining layer and the first organic layer are made from the same material and have an integrated structure.

Optionally, a lateral wall of the second pixel defining layer is covered with a reflecting material layer or a light-absorbing material layer.

Optionally, the first organic material is polyimide.

Optionally, the transparent substrate layer further comprises a first inorganic layer in contact with the first organic layer.

Optionally, a material for the first inorganic layer comprises one or more selected from the group consisting of silicon nitride, silicon oxynitride and silicon oxide.

Optionally, the transparent substrate layer further comprises a second organic layer, and the first inorganic layer is sandwiched between the first organic layer and the second organic layer.

Optionally, the second pixel defining layer comprises a carbonized organic material.

Optionally, a sum of thicknesses of the transparent substrate layer and the second pixel defining layer is greater than or equal to 10 μm.

Optionally, the light emitting device layer comprises an OLED having a blue light emitting layer.

Optionally, the OLED having a blue light emitting layer further has a cyan light emitting layer, a red light emitting layer, a green light emitting layer and/or a yellow light emitting layer which is/are stacked with the blue light emitting layer.

Optionally, the wavelength converting unit comprises one or more selected from the group consisting of an organic fluorescent down-converting material, an organic fluorescent up-converting material, a quantum dot down-converting material and a rare earth up-converting material.

Optionally, the display panel further comprises:

a transparent scattering unit on a side of the transparent substrate layer away from the thin film transistor layer, wherein the transparent scattering unit is in contact with the transparent substrate layer and is defined by the second pixel defining layer.

Optionally, the display panel further comprises:

a color film unit on a side of the wavelength converting unit away from the transparent substrate layer.

Optionally, an orthogonal projection of the wavelength converting unit on the transparent substrate layer has an area greater than that of an orthogonal projection of the light emitting device on the transparent substrate layer.

In another aspect, the present disclosure provides a method for manufacturing the display panel described above, comprising:

(i) forming a base film on a temporary base substrate, such that the base film is transparent in a thickness of at least 5 μm from a surface on a side away from the temporary base substrate;

(ii) forming a thin film transistor layer and a light emitting device layer sequentially on a side of the base film away from the temporary base substrate to form a bottom emitting type array substrate;

(iii) peeling off the temporary base substrate to expose a surface of the base film on a side away from the thin film transistor layer;

(iv) etching the exposed surface to form an array of pits, wherein the base film remained at the pits has a thickness of 5 μm or less; and (v) filling the pits with a wavelength converting material to form a wavelength converting unit.

Optionally, in step (i), the base film is fully transparent; and in step (v), before filling with the wavelength converting material, a reflecting material layer or a light-absorbing material layer is formed on a lateral wall of each of the pits.

Optionally, the base film comprises an opaque first sub-layer and a transparent second sub-layer, and in step (i), the opaque first sub-layer is firstly formed on the temporary base substrate, and the transparent second sub-layer is then formed on a side of the opaque first sub-layer away from the temporary base substrate.

Optionally, the opaque first sub-layer is obtained by carbonizing a transparent organic material layer.

DETAILED DESCRIPTION

Figure 1:
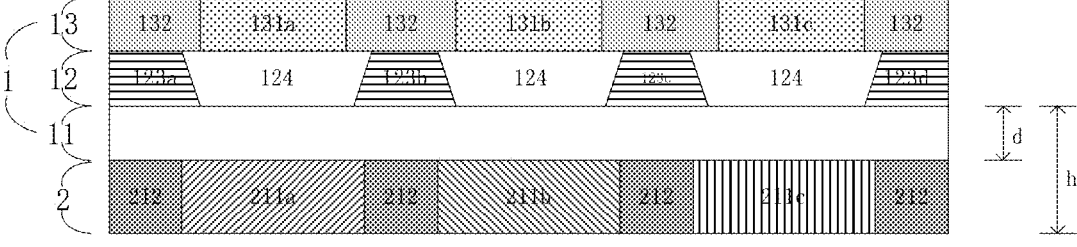
FIG. 1 shows a schematic sectional view of an embodiment of the present disclosure.

An array substrate is an important component of a display panel. The array substrate comprises an array of light emitting devices, an array of thin film transistors (TFTs) for controlling the light emitting devices, and a related drive circuit. The array substrates may be typically classified into a top emitting type and a bottom emitting type. In the top emitting type array substrate, the light emitting devices are closer to the light-exiting surface of the array substrate than the TFTs. In contrast, in the bottom emitting type array substrate, the light emitting devices are further away from the light-exiting surface of the array substrate than the TFTs. Generally, because of the presence of the TFTs, the bottom emitting type array substrate has a lower aperture ratio than that of the top emitting type array substrate.

In the related art, it has been proposed to combine the top emitting type array substrate with a wavelength converting layer to form a display panel. The wavelength converting layer refers to a film layer having the ability of converting wavelength, which may convert the wavelength of a light emitted by the light emitting device to a desired wavelength. The wavelength converting layer may be formed from a quantum dot material. The wavelength converting layer may be formed in a separate color film substrate, which will be assembled with the top emitting type array substrate in a cell alignment process. The wavelength converting layer may also be directly stacked on the top emitting type array substrate, which is called an On-EL process. The theory of the wavelength converting layer is different from that of the color film layer. A color film is an optical component which selectively transmits a specific wavelength. The color film will filter off unwanted wavelength from a backlight, and only allow a light with a desired wavelength passing through. Although a wavelength converting unit such as QD wavelength converting unit is also called a color film in the related art, in the display panel of the present disclosure, the color film specifically refers to a component which achieves a desired color without converting wavelength, unless specifically stated otherwise.

In the display panel comprising a wavelength converting layer, cross color between adjacent sub-pixels due to light leakage is a severe problem.

Without being bound to any theory, the inventors of the present disclosure have found that overly thick transparent encapsulation layer on the top of the top emitting type array substrate is an important cause of light leakage between adjacent sub-pixels. Particularly, no matter whether the wavelength converting layer is provided on the top of the top emitting type array substrate by the cell alignment process or by the On-EL process, it is necessary to first encapsulate the light emitting devices in the array substrate. Typically, for the purpose of protecting the OLED, after the formation of a light emitting device such as an OLED is completed, for example, after a common cathode is disposed, it is necessary to provide a transparent encapsulation layer on its top surface. The transparent encapsulation layer forms a space where light leakage between the OLED device and the wavelength converting layer may occur. The transparent encapsulation layer is typically formed by mixed stacking of an organic film layer and an inorganic film layer. Due to the limitation on the material property, the thickness of the transparent encapsulation layer cannot be too small, otherwise it will not provide sufficient protection for the OLED.

For example, an organic film is typically provided in the transparent encapsulation layer, and the organic film typically has a thickness not less than 10 μm. If no organic film of such thickness is provided, the protection for the OLED will be insufficient. Therefore, although it is desired to reduce light leakage and cross color by thinning the transparent encapsulation layer, light leakage and cross color cannot be reduced because the thickness of the encapsulation layer cannot be further reduced. Furthermore, when using the cell alignment process, a transparent filler will sometimes be filled between the array substrate and the color film substrate, and there will also be a certain thickness of transparent encapsulation layer on the surface of the color film substrate. Both the transparent filler and the transparent encapsulation layer will further increase the space of light leakage.

The inventors of the present disclosure have surprisingly found that if the bottom emitting type array substrate is used to be combined with the wavelength converting layer, the thickness of the space where light leakage may occur between the wavelength converting layer and array substrate will be reduced to 5 μm or less, thereby reducing light leakage and cross color. The inventors of the present disclosure have found that because the film layer of the bottom emitting type array substrate where the TFTs are located protects the OLED light emitting devices partially, the transparent substrate layer on the light-exiting side of the bottom emitting type array substrate may have a much smaller thickness than that of the transparent encapsulation layer on the light-exiting side of the top emitting type array substrate.

In particular, in an embodiment, the present disclosure provides a display panel comprising:

a transparent substrate layer;

a thin film transistor layer on a side of the transparent substrate layer;

a first pixel defining layer on a side of the thin film transistor layer away from the transparent substrate layer and having a plurality of first openings;

a plurality of light emitting devices arranged in an array in the plurality of first openings and on a side of the thin film transistor layer away from the transparent substrate layer, wherein the light emitting devices are bottom emitting type light emitting devices;

a second pixel defining layer on a side of the transparent substrate layer away from the thin film transistor layer and having a plurality of second openings; and a wavelength converting layer having a plurality of wavelength converting units, each of the wavelength converting units being disposed in one of the second openings and in contact with the transparent substrate layer;

wherein the transparent substrate layer has a thickness less than or equal to 5 μm.

The display panel of the present disclosure is based on a bottom emitting type array substrate, and may overcome the previous problems which cannot be overcome when forming a wavelength converting type display panel by using a top emitting type array substrate.

The bottom emitting type array substrate comprises a transparent substrate layer, a thin film transistor layer on a side of the transparent substrate layer, and a light emitting device layer on a side of the thin film transistor layer away from the transparent substrate layer, which are similar to those in the conventional bottom emitting type array substrate in the related art. The transparent substrate layer is the substrate layer of the bottom emitting type array substrate and is transparent to allow lights emitted by the light emitting devices in light emitting device layer going out from the bottom of the array substrate. In the bottom emitting type array substrate, the thin film transistor layer is located between the light emitting device layer and the transparent substrate layer, and comprises thin film transistors. The thin film transistor layer may further comprise a drive circuit. The light emitting device layer comprises a first pixel defining layer, and the bottom emitting type light emitting devices are arranged in an array in the openings of the first pixel defining layer. Any arrangement in the related art may be used for the arrangement of the transparent substrate layer, the thin film transistor layer and the light emitting device layer, as long as it does not conflict with the principle of the present disclosure.

In contrast to the related art, the thickness of the transparent substrate layer is specially limited to 5 μm or less in the present disclosure. The transparent substrate layer will serve as a transparent spacing layer between the light emitting film layer and the wavelength converting film layer in the wavelength converting type display panel. Further, the inventors have found that a transparent spacing layer thickness of 5 μm or less will substantially eliminate light leakage and cross color. In the present disclosure, the transparent substrate layer is located at the lowest level of the bottom emitting type array substrate, and comprises a combination of all completely transparent layers at the lowest level of the bottom emitting type array substrate. The completely transparent layer means a layer which covers the entire display area and has no any opaque component such as a drive circuit and a TFT.

The second pixel defining layer on a side of the transparent substrate layer away from the thin film transistor layer and wavelength converting units in the second openings of the second pixel defining layer are provided, wherein the wavelength converting units are in contact with the transparent substrate layer and defined by the second pixel defining layer. Both the second pixel defining layer and the wavelength converting units are located on the light-exiting side of the bottom emitting type array substrate. The second pixel defining layer is typically composed of grid-like walls, and defines spaces arranged in an array. When such spaces are filled with a wavelength converting material, the wavelength converting units are formed. Further, optionally, as described below, in addition to forming the wavelength converting units, such spaces may also be filled with a transparent scattering material to form transparent scattering units.

The wavelength converting units are in contact with the transparent substrate layer, such that light from the light emitting device layer passes through the thin film transistor layer and the transparent substrate layer and then arrives at the wavelength converting units. The components such as the thin film transistor and the drive circuit in the thin film transistor layer block and limit lights emitted by the light emitting devices, and the lights only transmit through the transparent portion of the thin film transistor layer. Therefore, only those lights which transmit through the thin film transistor layer may cause light leakage, and the space for light leakage is confined in the transparent substrate layer. Because the thickness of the transparent substrate layer is 5 μm or less, light leakage and cross color are substantially eliminated. More preferably, the thickness of the transparent substrate layer may be 3 μm or less, and further preferably below 3 μm. In addition, the thickness is 1 μm or more, and further preferably 2 μm or more. Overly thin transparent substrate layer or lack of transparent substrate layer cannot provide sufficient protection for the array substrate.

As described below, in some embodiments, the pixel defining layer and the transparent substrate layer may be formed from the same material, and there may be no interface distinguished by different substances therebetween. Therefore, the thickness of the transparent substrate layer is determined according to the interfaces between the wavelength converting units and the transparent substrate layer.

In an ideal condition, all interfaces between the wavelength converting units and the transparent substrate layer are in the same plane. In a practical product, the interfaces between the wavelength converting units and the transparent substrate layer may be not in one plane. Simply, an average of thicknesses from the interfaces between the wavelength converting units and the transparent substrate layer to the surface of the transparent substrate layer away from the wavelength converting units is considered as the thickness of the transparent substrate layer.

The display panel of the present disclosure comprises sub-pixels arranged in an array, wherein the sub-pixels arranged in an array comprises a first color sub-pixel, and the wavelength converting units comprises a first wavelength converting unit. The sub-pixels arranged in an array may further comprise a second color sub-pixel, a third color sub-pixel, even a fourth color sub-pixel, or more sub-pixels. The specific arrangement of sub-pixels is not particularly limited in the present disclosure.

The wavelength converting units comprises a first color wavelength converting unit suitable for the first color sub-pixel, which may convert light into a first color light. The wavelength converting unit may further comprise a second color wavelength converting unit suitable for the second color sub-pixel, a third color wavelength converting unit suitable for the third color sub-pixel, and so on.

The first color sub-pixel comprises the first color wavelength converting unit and a light emitting device in the light emitting device layer, which are stacked. The expression "stacked" means that both of them are arranged vertically in a direction of the transparent substrate layer, but may be not in contact with each other. That is, an orthogonal projection of the first color wavelength converting unit on the transparent substrate layer is overlapped with that of the light emitting device on the transparent substrate layer. Thus, in the first color sub-pixel, light emitted by the light emitting device passes through the thin film transistor layer and the transparent substrate layer, then arrives at the first color wavelength converting unit, and is converted to a first color light by the first color wavelength converting unit. As described below, one sub-pixel may comprise one light emitting device, or a plurality of stacked light emitting devices.

Similarly, one sub-pixel of another color may comprise a wavelength converting unit for another color and a light emitting device in the light emitting device layer, which are stacked.

When a sub-pixel color is the same as the color of the light emitted by the light emitting device, the space defined by the pixel defining layer in that sub-pixel may also not filled with a wavelength converting material, but with a transparent scattering material, such that the wavelength of the light emitted by the light emitting device is not converted. Here, the transparent scattering material means that it is transparent at least for the light with the color of that sub-pixel, and comprises a color film material which only allows the light with such color to pass through. A transparent material or a light filtering material having no scattering property may also be used, but the material having a scattering property is preferred. Nevertheless, the display panel of the present disclosure at least comprises a kind of sub-pixel having a color, i.e., a first color sub-pixel, which comprises a first wavelength converting unit. Sub-pixels of other colors may all comprise a wavelength converting unit. Alternatively, some of them may comprise a wavelength converting unit, while some of them may comprise a transparent scattering unit.

In the display panel of the present disclosure, the pixel defining layer and the wavelength converting units are directly provided on the transparent substrate layer at the light-exiting surface of the bottom emitting type array substrate, and the thickness of the transparent substrate layer is limited to 5 μm or less. Thus, there is little space for light leakage into an adjacent sub-pixel for the light emitted from the array substrate, so the problem of light leakage and cross color may be substantially eliminated.

The base substrate typically comprises an organic layer, and the preparation of a thin organic layer (for example, an organic layer having a thickness of 5 μm or less) is very demanding on the process. In the related art, when the display panel uses a bottom emitting type array substrate which is not combined with a wavelength converting layer, because there is no serious problem of cross color, the transparent base substrate will not be reduced to 5 μm or less from the viewpoint of simple process. If a top emitting type array substrate is used in combination with a wavelength converting layer, the transparent encapsulation layer comprising an organic layer will have a thickness not less than 10 μm, otherwise sufficient protection for the light emitting device cannot be achieved. It has not been found in the related art that when a bottom emitting type array substrate is used in combination with a wavelength converting layer, the film layer in which the TFTs are located can partially protect the OLED light emitting device, so the thickness of the transparent encapsulation layer may be reduced, thereby reducing the problem of cross color.

FIG. 1 shows a schematic sectional view of an embodiment of the present disclosure. The display panel P of the present disclosure comprises a bottom emitting type array substrate 1 and a wavelength converting component 2. The bottom emitting type array substrate 1 comprises at least a transparent substrate layer 11, an array substrate layer 12 and a light emitting device layer 13. The transparent substrate layer 11 is a substrate layer of the bottom emitting type array substrate, and is transparent. The expression "transparent" in the present disclosure refers to a material having a transmittance of 60% or more, preferably 70% or more, more preferably 80% or more, and further preferably 90% or more. The substrate layer 11 may be composed of a plurality of transparent sub-layers. A thin film transistor layer 12 is provided on a side of the substrate layer 11, and comprises an array of thin film transistors 123 and a transparent portion 124. The thin film transistor layer 12 may further comprise a drive circuit. The transparent portion 124 may comprise a layer laid on the entire surface, such as a gate insulating layer, an interlayer dielectric layer, and a planarization layer. A light emitting device layer 13 is on a side of the thin film transistor layer 12 away from the transparent substrate layer 11, and may comprise a plurality of light emitting devices 131. The light emitting devices 131 may be any suitable light emitting device such as an OLED, and may comprise a transparent anode, an organic light emitting layer, a reflecting cathode and so on, which are stacked. The transparent anode may be indium tin oxide (ITO), indium zinc oxide (IZO) and so on. One or more selected from the group consisting of Al, Mg, Ag, Au and Cu may be used as the reflecting cathode. The light emitting devices 131 are electrically connected to and controlled by the thin film transistors 123. For example, the light emitting device 131*a* is electrically connected to and controlled by the thin film transistor 123*a*, the light emitting device 131*b* is electrically connected to and controlled by the thin film transistor 123*b*, and the light emitting device 131*c* is electrically connected to and controlled by the thin film transistor 123*c*. There may be a light emitting unit defining layer 132 between the light emitting devices 131. The transparent substrate layer 11, the thin film transistor layer 12 and the light emitting device layer 13 form a bottom emitting type array substrate, and the lights emitted by the light emitting devices 131 pass through the transparent portion 124 and the transparent substrate layer 11 to be emitted towards the bottom side. The light emitting devices 131*a*, 131*b* and 131*c* may emit lights with the same color.

A wavelength converting portion 2 is provided on a side of the transparent substrate layer 11 away from the thin film transistor layer 12. The wavelength converting portion 2 at least comprises a pixel defining layer 212 and a first color wavelength converting unit 211*a*. For instance, the wavelength converting portion may also comprise a second color wavelength converting unit 211*b* and a transparent scattering unit 211*c*. 211*a*, 211*b* and 211*c* are in contact with the transparent substrate layer 11. In the figure, the first color wavelength converting unit 211*a* and the light emitting device 131*a* are stacked to form a first color sub-pixel. Likewise, the second color wavelength converting unit 211*b* and the light emitting device 131*b* are stacked to form a second color sub-pixel. The transparent scattering unit 211*c* and the light emitting device 131*c* are stacked to form a third color sub-pixel. Thus, the wavelength of a light output from the bottom emitting type array substrate may be converted to achieve a color display.

In the present disclosure, the thickness d of the transparent substrate layer is less than 5 µm. As such, it is very difficult for a light output from the transparent portion 124 to leak into an adjacent sub-pixel through such a thin transparent substrate layer. For example, after the light emitted by the light emitting unit 131*a* towards the bottom side passes through the transparent portion 124 into the transparent substrate layer 11, the amount of the light which can arrive at the wavelength converting unit 211*b* of the adjacent sub-pixel is very small because the transparent substrate layer has a very small thickness. Thus, light leakage and cross color may be substantially avoided. If the transparent substrate layer 11 has a thickness d greater than 5 µm, for example, a thickness of 10 µm or more, it is very likely that the light emitted by 131*a* will arrive at 211*b* and lead to cross color.

It should be noted that FIG. 1 is only a schematic diagram for illustrating the basic configuration and principle of the present disclosure, but does not represent the real shape, size and scale. For example, in the figure, the sectional shape of the wavelength converting unit 211*a* is rectangle, but may also be another shape, such as normal trapezoid and inverse trapezoid. In the present disclosure, the normal trapezoid in the section represents a trapezoid which has a narrow top edge and a broad bottom edge; and the inverse trapezoid represents a trapezoid which has a broad top edge and a narrow bottom edge. In a practical device, the section may also have a non-standard geometric shape. The thin film transistors and the light emitting devices in the figure are all presented in the form of modules. However, actually, they have particular film layer structures, which may be known in the related art.

In an embodiment, the transparent substrate layer comprises a first organic layer, wherein the first organic layer is in contact with the wavelength converting unit and comprises a first organic material. In other words, the transparent substrate layer comprises an organic layer as its bottom sub-layer. As compared to the transparent substrate layer composed of purely inorganic layers, the transparent substrate layer comprising an inorganic sub-layer has significantly better properties, including but not limited to bending resistance, elasticity and sealing property, and may be used in a flexible display device. The first organic layer as a bottom sub-layer of the transparent substrate layer also facilitates the preparation. During the preparation, a bottom emitting type array substrate is typically prepared by layer-by-layer stacking on a temporary base substrate. Therefore, in consideration of the process of peeling off the prepared array substrate from the temporary base substrate, it is advantageous to use the first organic layer as a bottom sub-layer.

The first organic layer may have a thickness in [1.5 µm, 4.5 µm], or in [2.5 µm, 3.5 µm], such as a thickness of 3 µm.

Figure 2:
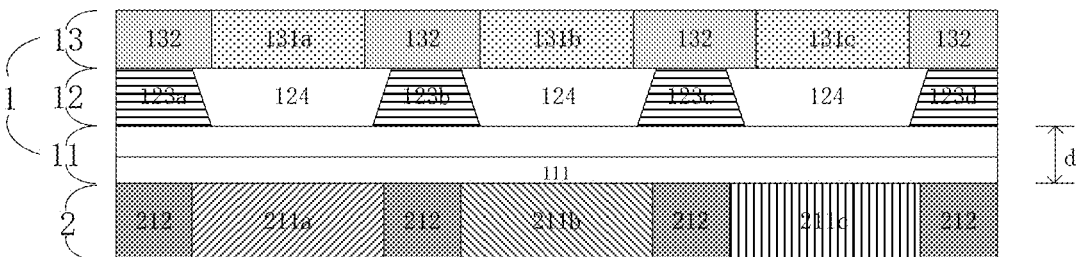
FIG. 2 schematically shows an embodiment in which the transparent substrate layer comprises a first organic layer.

FIG. 2 schematically shows an embodiment in which the transparent substrate layer comprises a first organic layer. The first organic layer 111 is a bottom sub-layer of the transparent substrate layer 11, and may be prepared from a first organic material.

In an embodiment, the second pixel defining layer and the first organic layer are made from the same material and have an integrated structure.

As described above, the preparation of a thin organic layer is very demanding on the process. The inventors of the present disclosure have found that the preparation of a thin organic layer may be avoided by integrally forming the pixel defining layer and the first organic layer from the same material. In other words, a relatively thick organic layer may be firstly prepared, and then a pixel defining layer may be formed by subtractive manufacture. In an embodiment, a relatively thick first organic material layer is firstly formed on a temporary base substrate; a bottom emitting type array substrate is prepared thereon; subsequently, the temporary base substrate is removed to expose the surface of the first organic material layer; a portion of the first organic material is removed to form pits of a certain depth on the exposed surface; thus, the remaining first organic material extending on the entire surface forms a relatively thin first organic layer, while the remaining first organic material surrounding the pits forms a pixel defining layer. By using such a subtractive manufacture process, a thin first organic layer may be obtained without preparing a thin organic layer, and a thin transparent substrate layer is obtained in turn.

When the wavelength converting units and the like are additionally provided on the bottom side of the bottom emitting type array substrate, if a process where the substrate comprising wavelength converting units (such as a color film substrate) is separately formed and then assembled with cell aligned is employed, the thin transparent substrate layer will be easily damaged due to pressure stress during the cell alignment. If an On-EL additive manufacture process with a transparent substrate layer as the substrate is employed, the patterning and solidifying process for forming a pixel defining layer may involves a high temperature treatment, which may be detrimental to the light emitting device. The inventors have found that when forming a bottom emitting type array substrate, the thickness thereof may be increased in advance and a portion of material at its bottom may be removed by a subtractive manufacture process, thereby obtaining a second pixel defining layer while achieving a thin transparent substrate layer. This may overcome the problems encountered in the cases of the above cell alignment and additive manufacture processes.

The first organic layer and the second pixel defining layer which may be prepared by a subtractive manufacture process as described above have an integral first organic material. Because the first organic layer is transparent, if the second pixel defining layer is not further treated, it may cause the wavelength-converted lights of adjacent sub-pixels to interfere with each other. In an embodiment, a lateral wall of the second pixel defining layer may be covered with a reflecting material layer or a light-absorbing material layer.

A material for the reflecting material layer may be metal. The thickness may be selected as appropriate, and may be for example in a range of [1000 Å, 3000 Å]. Preferably, the material of Ag is used. Any suitable metal material such as Al, Ti and Ni may also be used. The metal material layer may be made by sputtering and etching.

A material for the light-absorbing material layer may be, for example a black material layer, for example a coating black pigment, or any other coating layer having the ability of absorbing light.

Figure 3:
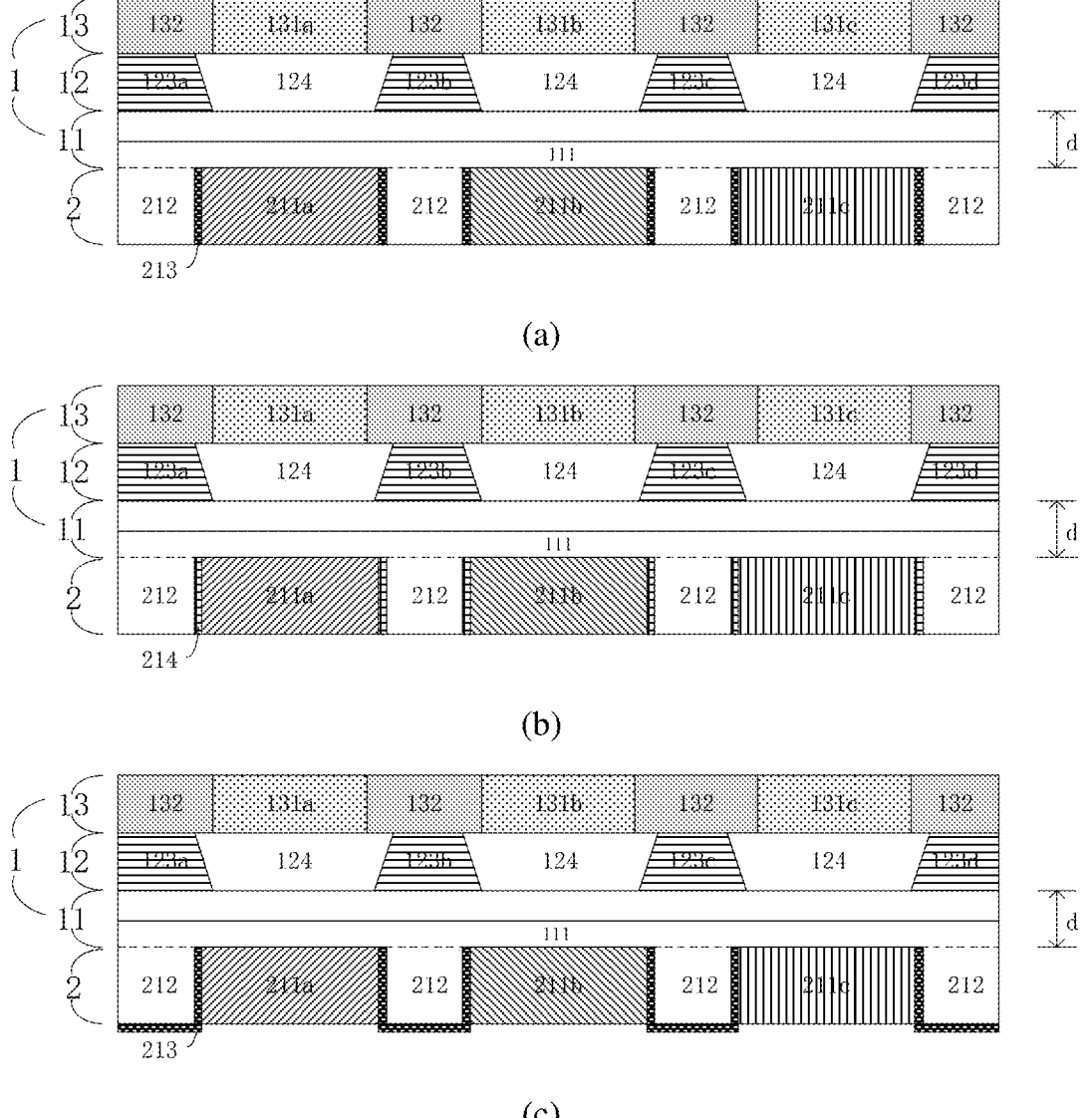
FIGS. 3(a)-(c) schematically show embodiments in which the pixel defining layer may be formed by a subtractive manufacture process and the lateral wall is treated.

FIGS. 3(a)-(c) schematically show embodiments in which the pixel defining layer may be formed by a subtractive manufacture process and the lateral wall is treated. In the figure, the dash lines between the pixel defining layer and the first organic layer 111 mean that both of them are made from the same material. Such a structure may be formed by removing a portion of the first organic material at the bottom side from the first organic material layer having a thickness equal to a sum of thicknesses of the first organic layer and the pixel defining layer. Specifically, a portion of the first organic material is removed to form pits which are used for filling 211a, 211b and 211c. In order to prevent the interference among 211a, 211b and 211c, the lateral wall of the pixel defining layer 212 may be treated before filling them. FIG. 3(a) shows that a light-absorbing material layer 213 may be formed on the lateral wall. FIG. 3(b) shows that a reflecting material layer 214 may be formed on the lateral wall. The reflecting material may be a metal coating layer. FIG. 3(c) shows that the light-absorbing material layer 213 may also cover the bottom surface of the pixel defining layer 212 on a side away from the transparent substrate layer. Forming a reflecting material layer on the bottom surface of the pixel defining layer on a side away from the transparent substrate layer may cause the display panel to reflect an external light. In addition, the light-absorbing material layer and the reflecting material layer may also cover only a portion of the lateral wall of the pixel defining layer. Nevertheless, from the viewpoint of preventing interference, it is more preferably to cover the lateral wall entirely.

In an embodiment, the first organic material is polyimide (PI). PI has particularly suitable mechanical properties and transparency. Further, PI is also flexible, and may be used in a flexible display panel. Therefore, when being combined with the transparent film layer in the thin film transistor layer, even if the thickness is small, it is sufficient to provide enough protection for the light emitting devices in the bottom emitting type array substrate (such as the light emitting material layer therein). A thin PI layer is also sufficient to provide acceptable protection for the thin film transistor layer. The first organic material may also be another transparent flexible organic material. For example, the first organic material may also be polyacrylate.

In an embodiment, the transparent substrate layer further comprises a first inorganic layer in contact with the first organic layer. In other words, the transparent substrate layer further comprises an inorganic sub-bottom layer as a barrier layer. The first inorganic layer provides sufficient water resistance, oxygen barrier property and so on for the thin film transistor layer and the light emitting device layer in the bottom emitting type array substrate.

The transparent substrate layer comprising the combination of the first organic layer and the first inorganic layer is particularly preferred. Because it comprises both an organic layer and an inorganic layer, it may sufficiently provide desired strength, elasticity, bending property, sealing property, water resistance and so on. In particular, the first inorganic layer formed on the organic layer also provides effective conduction and dispersion of stress within the display panel, thereby improving the properties of the display panel.

Figures 4, 5:
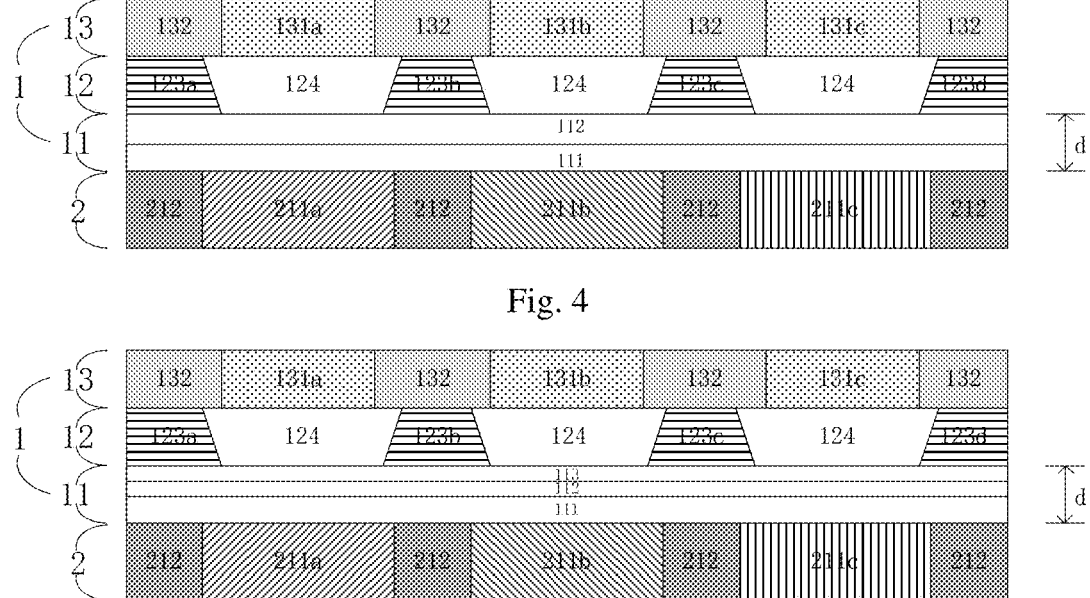
FIG. 4 schematically shows an embodiment in which the transparent substrate layer comprises a first inorganic layer in addition to the first organic layer.
FIG. 5 schematically shows an embodiment in which the transparent substrate layer comprises a second organic layer in addition to the first organic layer and the first inorganic layer.

FIG. 4 schematically shows an embodiment in which the transparent substrate layer comprises a first inorganic layer in addition to the first organic layer. The first inorganic layer 112 is adjacent to the first organic layer 111.

In an embodiment, the first inorganic layer is a silicon nitride (SiNx) layer, a silicon oxynitride layer, a silicon oxide (SiOx) layer, or a combination thereof. Those materials have good water resistance and mechanical properties. In consideration of the balance between the water resistance and the transparency as well as the preparation process, the first inorganic layer may have a thickness in [0.5 μm, 1.5 μm], such as a thickness of 1 μm.

In an embodiment, the transparent substrate layer further comprises a second organic layer containing an organic material in contact with the first inorganic layer. Further providing an organic layer on a side of the first inorganic layer may have a function of planarization, which facilitates the preparation of the thin film transistor layer, and the sandwich structure of organic-inorganic-organic also provides a transparent substrate layer having better mechanical properties. The second organic layer may have a thickness in [0.5 μm, 1.5 μm], such as a thickness of 1 μm.

FIG. 5 schematically shows an embodiment in which the transparent substrate layer comprises a second organic layer in addition to the first organic layer and the first inorganic layer. The second organic layer 113 is adjacent to the first inorganic layer 112.

The second pixel defining layer may not be a portion of the integrally formed first organic material layer. The second pixel defining layer may be a separately formed organic opaque layer. However, the second pixel defining layer is still formed by a subtractive manufacture process during the preparation of the bottom emitting type array substrate. As such, the bottom emitting type array substrate may be protected during the preparation process.

Specifically, a whole layer of organic opaque layer is firstly formed on a temporary base substrate for subsequently forming a second pixel defining layer. Subsequently, a transparent bottom layer of the bottom emitting type array substrate is formed on the whole layer of opaque layer. On the opaque layer, it is possible to still form the above first organic layer, and then form a first inorganic layer, a second organic layer and so on, or alternatively, it is also possible to directly form an inorganic layer, and then form an organic layer.

Figure 6:
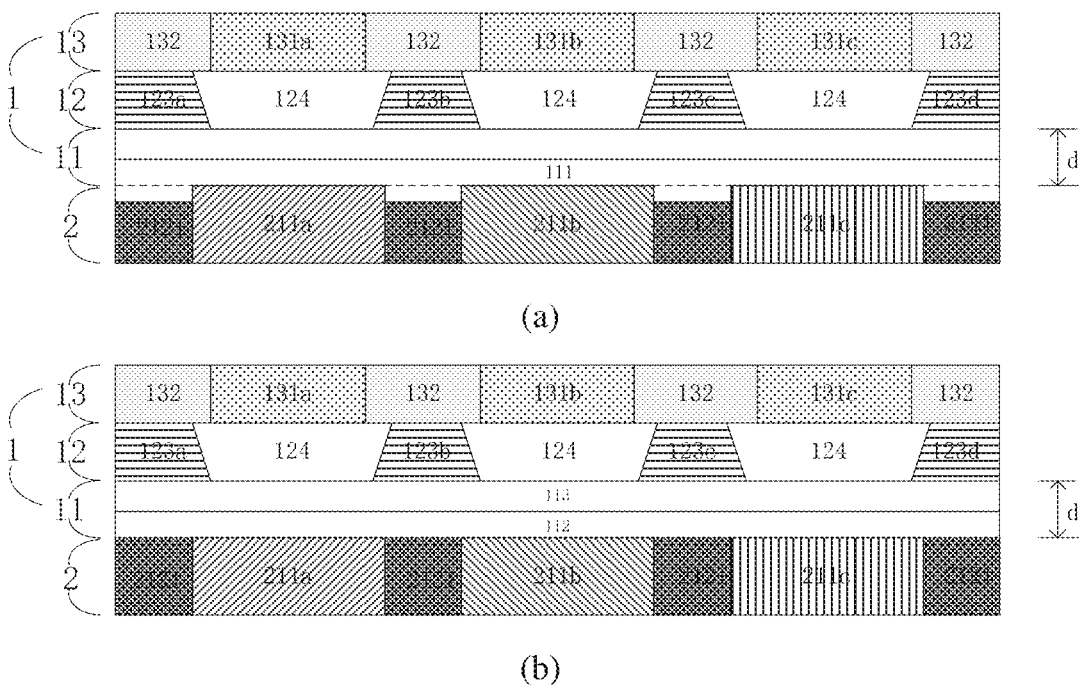
FIGS. 6(a) and (b) schematically show embodiments in which the second pixel defining layer is separately formed by a subtractive manufacture process.

FIGS. 6(a)-(b) schematically show embodiments in which the second pixel defining layer is separately formed by a subtractive manufacture process.

In FIG. 6(a), 2121 represents an opaque portion of the second pixel defining layer. Such a structure may be obtained by the following process. A whole layer of organic opaque layer 2121 is formed on a temporary base substrate, and then a first organic layer and a subsequent transparent layer are formed to obtain a transparent substrate layer. Subsequently, a thin film transistor layer 12 and a light emitting device layer 13 are formed. The part obtained is peeled off from the temporary base substrate, then the whole layer of opaque layer 2121 is etched, and the etched pits are filled with a wavelength converting material and so on. Because the first organic layer 111 and the opaque layer 2121 are both made from an organic material, it is not easy to control the etching to end at the boundary therebetween exactly. Nevertheless, the opaque layer 2121 may be slightly over-etched to ensure that a light emitted by the light emitting device may be output.

In FIG. 6(b), the transparent substrate layer comprises an inorganic layer 112 and an organic layer 113, and the inorganic layer is in contact with the wavelength converting unit. The bottom side of the transparent substrate layer is not the first organic layer 111 any longer. In this case, the inorganic layer 112 is provided after forming a whole layer of opaque layer 2121. In subsequent subtractive manufacture, the etching on the organic opaque layer 2121 may easily end at the inorganic layer 112.

A material for the organic opaque layer 2121 may be a black organic material such as a black PI material. Nevertheless, in an embodiment, the second pixel defining layer comprises a carbonized organic material. This may be achieved by coating a whole layer of transparent organic material and then heat-treating it. The carbonization of the organic material turns it from transparent to opaque. Looking for special black materials may be avoided by using the carbonized organic material. This is advantageous in process. For example, layers 2121 and 113 in FIG. 6(b) may be laid with the same material by the same apparatus without changing the apparatus and raw material, but subsequently, 2121 turns to opaque through carbonization.

In an embodiment, a total thickness of the transparent substrate layer and the second pixel defining layer is 10 μm or more. When the pixel defining layer and the pits are obtained by a subtractive manufacture process, the pits need to be deep enough (or in other words, the pixel defining layer needs to be high enough) for filling a wavelength converting material. The subtractive manufacture process may either start from the previous integral first organic material layer, or start from the material of the pixel defining layer and the transparent substrate layer which are formed from different materials respectively, wherein the material of the pixel defining layer extends on the entire surface. Another advantage of a total thickness of the transparent substrate layer and the second pixel defining layer of 10 μm or more is that as compared to small thickness, they may provide better strength and protection for the bottom emitting type array substrate before the subtractive manufacture step, which facilitates the transfer of the array substrate during the preparation, such that it will not be easily damaged.

The process of forming the material of the pixel defining layer and the transparent substrate layer from different materials respectively may comprise: forming an opaque first sub-layer firstly on a temporary base substrate, and then forming a transparent second sub-layer on a side of the opaque first sub-layer away from the temporary base substrate.

As shown in FIG. 1, a total thickness h of the transparent substrate layer and the pixel defining layer may be 10 μm or more.

In an embodiment, the light emitting device layer comprises an OLED having a blue light emitting layer. The technical solution, where an OLED having a blue light emitting layer is used in combination with red and green wavelength converting units and a transparent scattering unit to form a display panel comprising red, green and blue sub-pixels, is known. In an embodiment, a light emitting device such as a blue quantum dot light emitting diode (QLED) may also be used.

Figure 7:
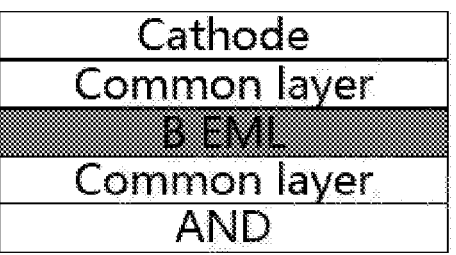
FIGS. 7(a)-(i) show exemplary embodiments of the OLEDs in the light emitting device layer.
Figure 7:
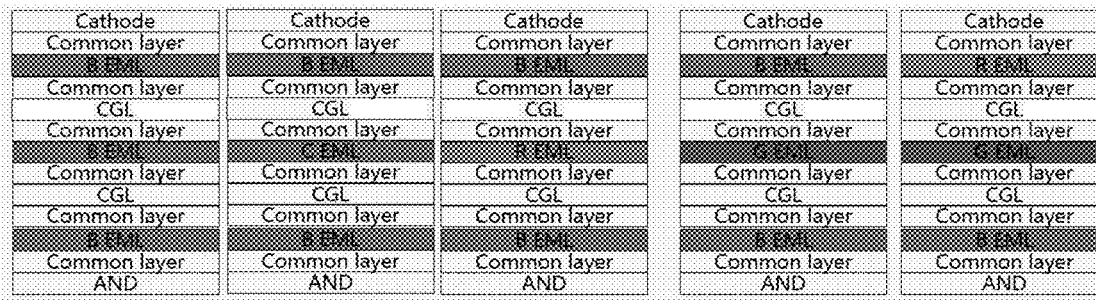

FIG. 7(a) shows an exemplary embodiment of the OLED in the light emitting device layer. Here, Cathode represents a reflecting cathode, and represents a transparent anode, B EML represents a blue light emitting layer, and Common layer typically represents a common functional layer which sub-pixels may share, including but not limited to an electron injection layer, an electron transport layer, a hole injection layer, and a hole transport layer. Any arrangement in the related art may be used for the arrangement of those functional layers in the OLED and the bottom emitting type array substrate, as long as it does not conflict with the principle of the present disclosure.

In a sub-pixel, the light emitting device may comprise a plurality of stacked light emitting layers. Between the stacked light emitting layers, a functional layer may be provided, and a charge generating layer may also be provided.

FIGS. 7(b) and (f) show exemplary embodiments of the OLEDs in the light emitting device layer. In the figures, there may be two and three stacked blue light emitting layers respectively between the cathode and the anode. The stacked blue light emitting layers each have a common functional layer which is shared with other sub-pixels. A charge generating layer (CGL) is further provided between the light emitting layers. The charge generating layer may be formed from any suitable material in the related art.

In an embodiment, the OLED having a blue light emitting layer further has a cyan light emitting layer, a red light emitting layer, a green light emitting layer and/or a yellow light emitting layer which is/are stacked with the blue light emitting layer. For example, the following stacked arrangement from bottom to top may be used: blue+green (FIG. 7(c)), blue+cyan (FIG. 7(d)), blue+yellow (FIG. 7(e)), blue+cyan+blue (FIG. 7(g)), blue+red+blue (FIG. 7(h)), blue+green+blue (FIG. 7(i)), blue+green+red (FIG. 7(j)), and so on. The stacking of the light emitting layers of different colors is advantageous for improving the display performance of a light with a particular wavelength. The light emitting device layer may comprise a blue OLED, and may also comprise an OLED having cyan, red, green and/or yellow light emitting layers stacked with the blue light emitting layer.

In an embodiment, the wavelength converting unit comprises one or more selected from the group consisting of an organic fluorescent down-converting material, an organic fluorescent up-converting material, a quantum dot down-converting material and a rare earth up-converting material.

The wavelength converting unit is used for converting the wavelength of the light emitted by the light emitting unit of the sub-pixel to a desired color. For example, a red wavelength converting unit may convert a blue backlight to a red light, and a green wavelength converting unit may convert a blue backlight to a green light. An example of the wavelength converting unit may be a quantum dot (QD) material portion, an inorganic phosphor powder material portion, or an organic phosphor powder material portion, and may comprise a transparent matrix material and quantum dots, inorganic phosphor powders or organic phosphor powders dispersed in the matrix material. The wavelength converting unit may also be made from another wavelength converting material. The matrix material may be a transparent organic material, such as resin, for example, cured photoresist resin, or cured ink. Any suitable down-converting material may be used as the down-converting material, which is not particularly limited in the present disclosure. In the above materials, the organic fluorescent down-converting material, the organic fluorescent up-converting material, the quantum dot down-converting material and the rare earth up-converting material are preferred. Here, the QD down-converting material is particularly preferred because its down-converting performance may be controlled through the particle size.

In an embodiment, the wavelength converting unit may comprise a base resin and quantum dots mixed with the base resin (or dispersed in the base resin). The base resin may be a medium in which the quantum dots are dispersed. The base resin may be formed from at least one of various resin composite materials which are generally referred to as an adhesive. However, the concept of the present disclosure is not limited thereto. For example, a medium capable of dispersing quantum dots may be used as the base resin, regardless of its name, additional functions and/or constituent materials. In some exemplary embodiments, the base resin may be a polymer resin. For example, the base resin may be an acrylic resin, an ethyl carbamate-based resin, a silicon-based resin, or an epoxy resin. The base resin may be a transparent resin.

The quantum dot may be a particle configured to convert the wavelength of an incident light. Each quantum dot may be a material having a crystal structure with a size of several nanometers, and may be composed of hundreds to thousands of atoms. The quantum dot may exhibit a quantum confinement effect, where the energy band gap is increased due to small size. When a light with a wavelength corresponding to an energy greater than the energy band gap is incident onto the quantum dot, the quantum dot may be excited by absorbing the light, and then turn to a ground state and emit a light with a particular wavelength at the same time. The emitted light may have an energy corresponding to the energy band gap. The light emitting property of the quantum dot due to the quantum confinement effect may be controlled by adjusting the size and/or composition of the quantum dot.

The quantum dot may be formed from a Group II-VI compound, a Group III-V compound, a Group IV-VI compound, a Group IV element, a Group IV compound, or any combination thereof.

The Group II-VI compound may be selected from the group consisting of: a binary compound selected from the group consisting of CdSe, CdTe, ZnS, ZnSe, ZnTe, ZnO, HgS, HgSe, HgTe, MgSe, MgS and any mixture thereof; a ternary compound selected from the group consisting of AgInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and any mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and any mixture thereof.

The Group III-V compound may be selected from the group consisting of: a binary compound selected from the group consisting of GaN, GaP, GaAs, GaSb, AlN, AlP, AlAs, AlSb, InN, InP, InAs, InSb and any mixture thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb and any mixture thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and any mixture thereof. The Group IV-VI compound may be selected from the group consisting of: a binary compound selected from the group consisting of SnS, SnSe, SnTe, PbS, PbSe, PbTe and any mixture thereof; a ternary compound selected from the group consisting of SnSeS, SnSeTe, SnSTe, PbSeS, PbSeTe, PbSTe, SnPbS, SnPbSe, SnPbTe and any mixture thereof; and a quaternary compound selected from the group consisting of SnPbSSe, SnPbSeTe, SnPbSTe and any mixture thereof. The Group IV element may be selected from the group consisting of Si, Ge and a mixture thereof. The Group IV compound may be a binary compound selected from the group consisting of SiC, SiGe and a mixture thereof.

In such cases, the binary compound, the ternary compound or the quaternary compound may be present in the quantum dot at a substantially uniform concentration. Alternatively, the binary compound, the ternary compound or the quaternary compound in a portion of the quantum dot may have a concentration different from that in another portion of the quantum dot.

Each quantum dot may have a core-shell structure comprising a core and a shell surrounding the core. Alternatively, the quantum dot may have a core/shell structure where one quantum dot surrounds another quantum dot. The interface between the shell and the core may have a concentration gradient, where the concentration of the element present in the shell is gradually decreased towards the center.

The quantum dot may be a nanoscale particle. Each quantum dot may have a full width at half maximum (FWHM) of the emission wavelength spectrum of about 45 nm or less, particularly about 40 nm or less, and more particularly about 30 nm or less, and the color purity and/or color reproducibility may be improved in such a range. Furthermore, the light emitted by the quantum dot may be output in all directions, and thus a wide viewing angle may be improved or achieved.

Furthermore, the shape of each quantum dot may be a common shape known in the art, but the shape of each quantum dot is not limited to any particular shape. For example, each quantum dot may have a spherical shape, a pyramid shape, a multi-arm shape, a cubic nanoparticle shape, a nanotube shape, a nanowire shape, a nanofiber shape or a nanoplate particle shape. The color of the light emitted by the quantum dot may be controlled depending on the particle size of the quantum dot, and thus the quantum dot may emit one of lights with various colors, such as red light, green light or blue light, particularly red light or green light.

In the present disclosure, unless otherwise specifically indicated, QD is used as an example for illustrating the wavelength converting material.

The QD wavelength converting unit may also contain scattering particles.

The QD wavelength converting unit may be prepared by filling a QD ink into the pits defined by the pixel defining layer through ink jet printing.

In an embodiment, a transparent scattering unit is on a side of the transparent substrate layer away from the thin film transistor layer, wherein the transparent scattering unit is also in contact with the transparent substrate layer and is defined by the second pixel defining layer. As described above, when the color of the sub-pixel is the same as the color of the light emitting unit, it is not necessary to provide a wavelength converting unit. The transparent scattering unit may be obtained by adding scattering particles into a transparent material.

As shown in FIG. 1, 211c may also be a transparent scattering unit. Nevertheless, the display panel of the present disclosure may also have no transparent scattering unit. For example, a third color wavelength converting unit may also be at the position of 211c.

In an embodiment, a color film unit on a side of the wavelength converting unit away from the transparent substrate layer. The color film unit may further purify the color of the emergent light from the sub-pixel by filtering light, while preventing external light from entering the wavelength converting unit or the transparent color filtering unit, thereby improving the display effect.

The pits defined by the pixel defining layer may be not fully filled with the wavelength converting units, and the remaining spaces may be filled with a color film material.

Figure 8:
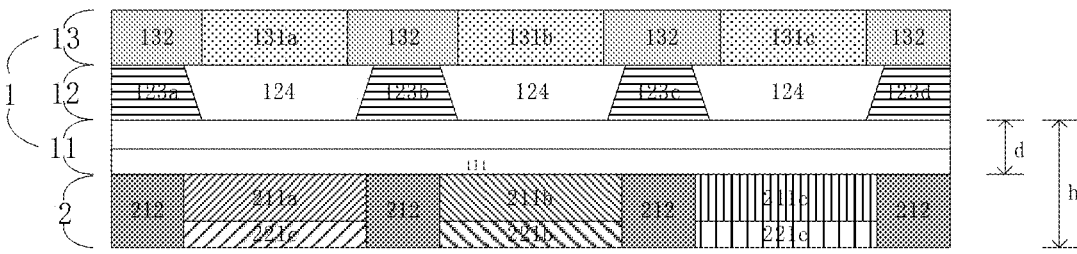
FIG. 8 shows an embodiment in which each of the sub-pixels further comprises a color film unit.

FIG. 8 shows an embodiment in which each of the sub-pixels further comprises a color film unit. The first color sub-pixel comprises a color film 221a with the first color, the second color sub-pixel comprises a color film 221b with the second color, and the third color sub-pixel comprises a color film 221c with the third color.

Alternatively, after forming the wavelength converting units and the optional transparent scattering unit, an additional black matrix may be formed on a side of the pixel defining layer away from the transparent substrate layer, and the space defined by the black matrix may be filled with a color film material with a desired color.

In an embodiment, an orthogonal projection of the wavelength converting unit on the transparent substrate layer has an area greater than that of an orthogonal projection of the light emitting device on the transparent substrate layer.

As described previously, the wavelength converting unit and the light emitting device are stacked. When the orthogonal projection of the wavelength converting unit has a larger area, more light output from the bottom emitting type array substrate may enter into the wavelength converting unit. Also, because the aperture ratio of the bottom emitting type array substrate is limited, using a wavelength converting unit having a larger area is advantageous for compensating the low aperture ratio and increasing the luminescence.

The display panel of the present disclosure may also have any suitable film layer in the related art, such as encapsulation cover plates on both sides.

Figure 9:
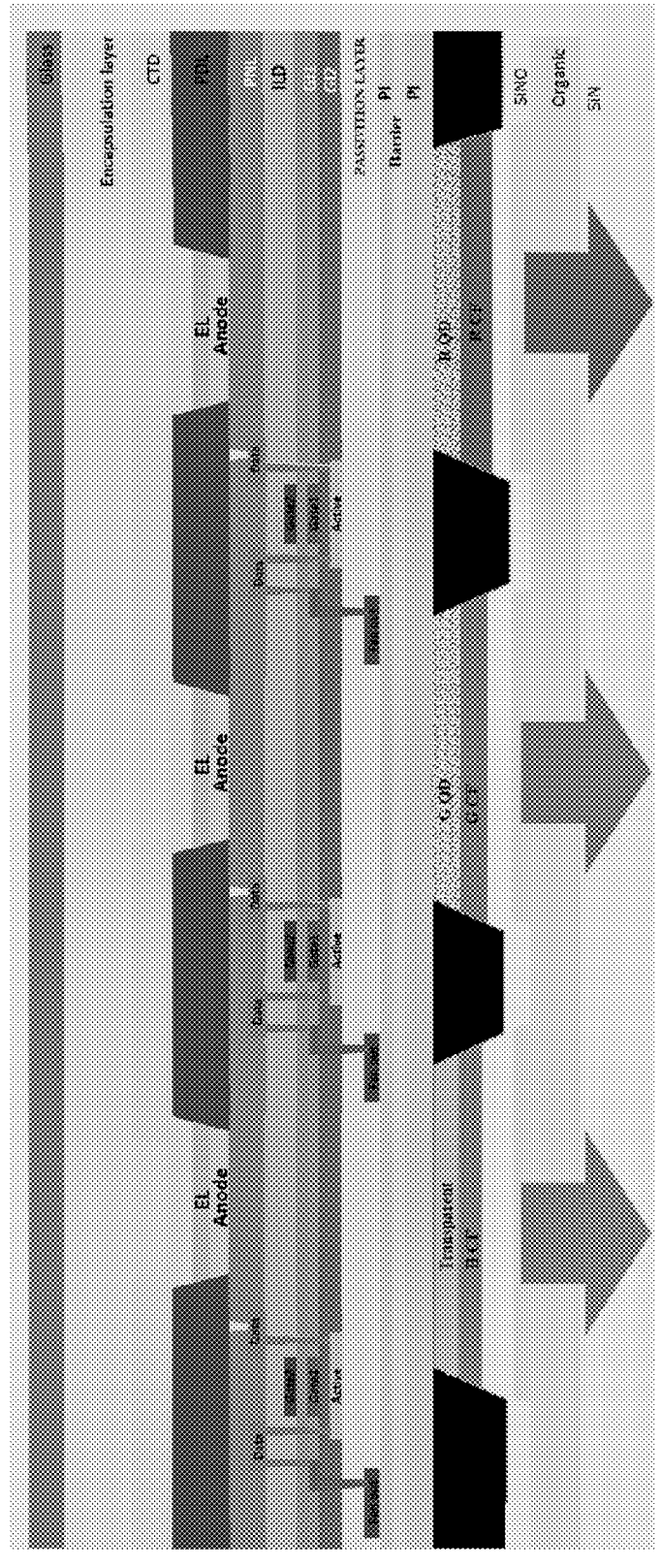
FIG. 9 shows a schematic diagram of an embodiment of the display panel according to the present disclosure.

FIG. 9 shows a schematic diagram of an embodiment of the display panel according to the present disclosure. In the figure, two PI layers and the first inorganic layer (Barrier) therebetween form a transparent substrate layer. A passivation layer (Passivation Layer) is on the transparent substrate layer, and comprises a drive circuit (Fan out). A first gate insulating layer (GI1), a second gate insulating layer (GI2), an interlayer dielectric layer (ILD), and a planarization layer (PNL) are formed on the passivation layer. During the formation of those layers, thin film transistors are formed in the thin film transistor region, wherein the thin film transistors each comprise an active layer (Active), a first gate electrode (Gate1), a second gate electrode (Gate2), source/drain electrodes (Data) and so on. The thin film transistors are electrically connected to and controlled by the drive circuit. A first pixel defining layer (PDL) of the light emitting device layer and the light emitting devices defined thereby are formed on the planarization layer for the thin film transistors. Fundamentally, the light emitting devices comprise a transparent anode (Anode), a light emitting layer (EL), and a common reflecting cathode (CTD). An encapsulation layer (Encapsulation Layer) may be further provided on the common cathode. Because it is a bottom emitting type array substrate, the thickness of the encapsulation layer will not affect light leakage, and may be sufficient to protect the light emitting layer (EL). A glass cover plate may be provided on the top of the device.

The total thickness of the transparent substrate layer is not more than 5 µm. Black inverse trapezoids below the transparent substrate layer represent a second pixel defining layer. Blue, green and red sub-pixels are in the spaces defined by the second pixel defining layer from left to right respectively. A transparent scattering unit (Transparent) and a blue color film (B CF) are stacked in the blue sub-pixel, a green quantum dot wavelength converting unit (G QD) and a green color film (G CF) are stacked in the green sub-pixel, and a red quantum dot wavelength converting unit (R QD) and a red color film R CF are stacked in the red sub-pixel. An encapsulation layer may be further provided below the color films, and comprises stacked layers of a silicon oxynitride layer (SiNO), an organic layer (Organic) and a silicon nitride layer (SiN).

FIG. 9 is only a schematic diagram for illustrating an embodiment of the present disclosure. More embodiments may be obtained with reference to the above description and the previous figures. For example, the transparent scattering unit (Transparent) in FIG. 9 may be made from the same material as that of the blue color film (B CF).

It is also proposed in the present disclosure to obtain the display panel of the present disclosure by a subtractive manufacture method, which may significantly reduce the process difficulty.

The subtractive manufacture method comprises steps of:
   (i) forming a base film on a temporary base substrate, such that the base film is transparent in a thickness of at least 5 µm from a surface on a side away from the temporary base substrate;
   (ii) forming a thin film transistor layer and a light emitting device layer sequentially on a side of the base film away from the temporary base substrate to form a bottom emitting type array substrate;
   (iii) peeling off the temporary base substrate to expose a surface of the base film on a side away from the thin film transistor layer;
   (iv) etching the exposed surface to form an array of pits, wherein the base film remained at the pits has a thickness of 5 µm or less; and
   (v) filling the pits with a wavelength converting material to form a wavelength converting unit.

In the above method, the base film will be subsequently used to form a transparent substrate layer and a pixel defining layer. This is achieved by removing a portion of the base film.

The base film may comprise the first organic layer, the inorganic waterproof layer, the second organic layer and so on as described previously. Optimally, the base film comprises a first organic material layer for forming integrated first organic layer and pixel defining layer. Nevertheless, it is also possible to form an opaque pixel defining layer and a transparent first organic layer in layers.

In a particular embodiment, a sufficiently thick first organic material layer is firstly formed on a temporary base substrate, and then an inorganic waterproof layer and an optional second organic layer are formed, thereby forming a fully transparent base film. Subsequently, a portion is removed from the sufficiently thick first organic material layer to form pits, the remaining first organic layer extending on the front surface and other transparent film layers form a transparent substrate layer, and the first organic material surrounding the pits is used to form a pixel defining layer.

In an embodiment, in step (i), the base film is fully transparent; and in step (v), before filling with the wavelength converting material, a reflecting material layer or a light-absorbing material layer is formed on a lateral wall of each of the pits.

Thus, an opaque pixel defining layer may be formed. After filling the wavelength converting material, a display panel in which the transparent spacing layer on the entire surface between the wavelength converting layer and the light emitting portion is less than 5 µm is obtained. Particular methods for forming a reflecting material layer or a light-absorbing material layer may be selected arbitrarily.

In addition to starting from the integrated first organic material layer, the subtractive manufacture may also start from the base film formed as having several layers. Although such a process involves a process of forming a thin organic layer and thus has some difficulty, a relatively thick base film, for example, a base film with a thickness of 10 µm or more, may be used in the preparation process due to subtractive manufacture. As described above, this is advantageous for the preparation of the array substrate and the transfer process after peeling off.

In an embodiment, the base film comprises an opaque first sub-layer and a transparent second sub-layer, and in step (i), the opaque first sub-layer is firstly formed on the temporary base substrate, and the transparent second sub-layer is then formed on a side of the opaque first sub-layer away from the temporary base substrate.

The first sub-layer and the second sub-layer may both be an organic layer. Alternatively, the first sub-layer is an organic layer, and the second sub-layer is a first inorganic layer.

When the first sub-layer and the second sub-layer are both an organic layer, the first sub-layer and the second sub-layer may be prepared by spin coating for example. Specifically, the first sub-layer and the second sub-layer may have thicknesses in range from 3 to 10 µm and from 10 to 3 µm respectively, and the preparation method is as follows: the paste is coated onto the substrate at a spin coating rate of 9000-2500 rpm and 2500-9000 rpm respectively, and then cured at a high temperature of 450° C.; or the paste is slit-coated at a coating rate of 0.1-0.5 m/s, and then cured at a high temperature of 450° C.

If the first sub-layer is an organic layer and the second sub-layer is an inorganic layer, the second inorganic layer may be deposited after forming the first sub-layer.

In any case, in the subsequent subtractive manufacture process, it is necessary to etch the first sub-layer to form pits, achieving the light transmitting of the transparent spacing layer.

In a further embodiment, the opaque first sub-layer is obtained by carbonizing the transparent organic material layer.

In such an embodiment, an opaque pixel defining layer is obtained through carbonization, without separately finding materials for the opaque first sub-layer. Particular carbonization process may comprise heating one side of an organic material with a heat source. For example, a polyimide material may be cured to a colorless polyimide at about 450° C. At this time, if the temperature is further increased, for example, to 500° C., the colorless polyimide will be carbonized to turn black, thereby obtaining an opaque first sub-layer.

Furthermore, it is also possible to firstly form a transparent substrate layer having a thickness less than 5 µm on a temporary base substrate and in turn form a bottom emitting type array substrate, and then form a wavelength converting layer, a color film and so on layer by layer by an On-EL or cell alignment process after removing the temporary base substrate. Nevertheless, in this embodiment, the transparent substrate layer is relatively thin and may be easily damaged during the transfer of the array substrate. Here, the cell alignment process is more unfavorable, because a thin transparent substrate layer will be easily damaged due to pressure stress during the cell alignment.

EXAMPLES

Example 1

A base film was prepared on a temporary base substrate, wherein the base film had an overall thickness of 11 µm. A polyimide solution was firstly spin coated at a spinning rate of 3500 rpm, and then cured to prepare a first organic layer having a thickness of 9 µm, as a colorless polyimide (CPI) film. Subsequently, 1 µm of first inorganic layer of SiNx was deposited by chemical vapor deposition (CVD). Finally, the polyimide solution was spin coated at a high spin rate of 7500 rpm to obtain a second organic layer having a thickness of 1 µm, as a colorless polyimide film.

A thin film transistor layer was prepared on the second organic layer by a conventional process.

A first pixel defining layer was firstly prepared on the thin film transistor layer, and then an indium tin oxide (ITO) transparent anode was deposited therein. Subsequently, a common functional layer and an organic light emitting layer were stacked layer by layer, wherein the organic light emitting layer comprised two blue light emitting layers. Finally, a common aluminum (Al) electrode was laid to form a light emitting device. A thin film encapsulation is performed on the aluminum electrode. The encapsulation layer had a three-layer structure, comprising a 5 µm SiON layer, a 15 µm acrylic resin layer, a 10 µm SiNx layer in this order from the cathode.

An ultraviolet (UV) curable adhesive was coated on the encapsulation layer to adhere the encapsulation cover plate, and cured. Subsequently, the temporary base substrate was removed by a laser peeling-off technique to expose the surface of the first organic layer.

The obtained bottom emitting type array substrate was transferred to the preparation procedure of the wavelength converting portion. The surface of the first organic layer as etched at positions corresponding to the sub-pixels to form pits surrounded by the second pixel defining layer. The pits had a depth of 8 µm. As such, 1 µm thickness of the first organic layer was remained at the pits.

80 nm of Al layer was deposited on the entire surface, and patterned, such that the aperture position of the sub-pixel, i.e. the second opening was exposed, while metal Al was remained on the lateral wall of the pixel aperture of the second pixel defining layer as a reflecting material layer, which may shield light to prevent light leakage or increase the light utilization in the second opening.

A red quantum dot material, a green quantum dot material and a transparent scattering material were ink jet printed in the pits. The materials were dried and cured to obtain a wavelength converting unit and a transparent scattering material having a thickness of 4 μm. Then, red, green and blue color film materials were further filled.

Finally, they were further encapsulated with a SiON film, an acrylic resin film and a SiN film in this order. Thus, the display panel of the present disclosure was formed. Here, the transparent substrate layer of the bottom emitting type array substrate formed a transparent spacing layer only having a thickness of 3 μm, substantially avoiding the occurrence of light leakage and cross color.

Example 2

A base film was prepared on a temporary base substrate, wherein the base film had an overall thickness of 11 μm. A polyimide solution was spin coated at a spin rate of 5000 rpm, and then cured at 450° C. to prepare a colorless polyimide (CPI) film having a thickness of 6 μm. Then, the CPI was heat-treated at 500° C. to be carbonized and turn black.

Subsequently, 1 μm of first inorganic layer of SiOx was deposited by CVD. Next, a polyimide solution was spin coated at a spin rate of 6000 rpm, and then cured at 450° C. to prepare a colorless polyimide (CPI) film having a thickness of 4 μm.

The bottom emitting type array substrate was formed and the temporary base substrate was removed by the same process as that in Example 1.

The obtained bottom emitting type array substrate was transferred to the preparation procedure of the wavelength converting portion. The carbonized polyimide film was etched till the first inorganic layer at positions corresponding to the sub-pixels to form pits surrounded by the second pixel defining layer. The pits had a depth of 6 μm.

Then, the wavelength converting unit, the color film unit and the encapsulation layer were formed by the same process as that in Example 1, wherein the wavelength converting unit and the color film unit had a thickness of 3 μm respectively.

Thus, the display panel of the present disclosure was formed. Here, the transparent substrate layer of the bottom emitting type array substrate formed a transparent spacing layer only having a thickness of 5 μm, substantially avoiding the occurrence of light leakage and cross color.

Example 3

The display panel was prepared by the process of Example 2, except that the second pixel defining layer was not obtained by carbonizing a transparent organic material, but was obtained by directly spin coating a black PI material and curing it.

Subtractive manufacture was still utilized in this process.

Example 4

A base film was fabricated on a temporary base substrate, wherein the base film had an overall thickness of 5 μm, comprising 3 μm of first organic layer prepared from polyimide, 1 μm of first inorganic layer and 1 μm of second organic layer.

After a thin film transistor layer and a light emitting unit layer were formed, the temporary base substrate was removed.

The surface of the first organic layer was patterned to form an opaque pixel defining layer having a height of 4 μm. Then, spaces defined by the pixel defining layer were respectively filled with a QD ink and a transparent scattering material to form a QD wavelength converting layer and a transparent scattering unit having a thickness of 4 μm.

A black matrix was further formed on the surface of the pixel defining layer, and spaces defined by the black matrix were filled with color film materials to form color film units. Then, an encapsulation layer and other layers were also formed.

A display panel comprising a transparent spacing layer with a thickness of 5 μm may also be obtained by the process of the present Example.

As compared to the cell alignment process, the wavelength converting portion formed on the bottom surface of the bottom emitting type array substrate by using the On-EL process will not cause damage to the film layers of the display panel due to pressure stress.

In the present Example, the black matrix was separated from the pixel defining layer. Such a process is also suitable for the embodiments of the present disclosure.

In the present disclosure, the transparent substrate layer of the bottom emitting type array substrate is used as a transparent spacing layer between the light emitting devices and the wavelength converting units. Because of the presence of the thin film transistor layer in the array substrate, the transparent substrate layer comprising an organic layer may have a thickness of 5 μm or less, and will not influence the encapsulation of the light emitting devices. Thus, a thin transparent spacing layer may be obtained, and the problems of light leakage and cross color between adjacent sub-pixels in the wavelength converting type display panel is substantially avoided. The present disclosure also specifically proposes to obtain a thin transparent substrate layer by a subtractive manufacture process. A relatively thick preset base film may provide better strength and protection during the transfer of the array substrate, and at least partially overcome the shortcomings in the cell alignment process and the additive manufacture process. More preferably, an integral material is used for a portion of the transparent substrate film and the second pixel defining layer to reduce the process difficulty in directly preparing a thin organic layer. An organic film and an inorganic waterproof film are used in combination in the base film, which may provide good mechanical properties and protection capability.

The above descriptions are only particular embodiments of the present disclosure, but the protection scope of the present disclosure is not limited thereto. Within the technical scope disclosed in the present disclosure, one skilled in the art can readily envisage variations and alternatives, and all of them are covered by the protection scope of the present disclosure. Therefore, the protection scope of the present disclosure should be defined by the appended claims.

What is claimed is:

1. A display panel comprising:
   a transparent substrate layer;
   a thin film transistor layer on a side of the transparent substrate layer;
   a first pixel defining layer on a side of the thin film transistor layer away from the transparent substrate layer and having a plurality of first openings;
   a plurality of light emitting devices arranged in an array in the plurality of first openings and on the side of the thin film transistor layer away from the transparent substrate layer, wherein the light emitting devices are bottom emitting type light emitting devices;

a second pixel defining layer on a side of the transparent substrate layer away from the thin film transistor layer and having a plurality of second openings; and a wavelength converting layer having a plurality of wavelength converting units, each of the wavelength converting units being disposed in one of the second openings and in contact with the transparent substrate layer;

wherein the transparent substrate layer has a thickness less than or equal to 5 μm.

2. The display panel according to claim 1, wherein the transparent substrate layer comprises a first organic layer, wherein the first organic layer is in contact with the wavelength converting unit and comprises a first organic material.

3. The display panel according to claim 2, wherein the second pixel defining layer and the first organic layer are made from the same material and have an integrated structure.

4. The display panel according to claim 3, wherein a lateral wall of the second pixel defining layer is covered with a reflecting material layer or a light-absorbing material layer.

5. The display panel according to claim 2, wherein the first organic material is polyimide.

6. The display panel according to claim 2, wherein the transparent substrate layer further comprises a first inorganic layer in contact with the first organic layer.

7. The display panel according to claim 6, wherein a material for the first inorganic layer comprises one or more selected from the group consisting of silicon nitride, silicon oxynitride and silicon oxide.

8. The display panel according to claim 6, wherein the transparent substrate layer further comprises a second organic layer, and the first inorganic layer is sandwiched between the first organic layer and the second organic layer.

9. The display panel according to claim 1, wherein the second pixel defining layer comprises a carbonized organic material.

10. The display panel according to claim 1, wherein a sum of thicknesses of the transparent substrate layer and the second pixel defining layer is greater than or equal to 10 μm.

11. The display panel according to claim 1, wherein the light emitting layer comprises devices comprise an OLED having a blue light emitting layer.

12. The display panel according to claim 11, wherein the OLED having a blue light emitting layer further has a cyan light emitting layer, a red light emitting layer, a green light emitting layer and/or a yellow light emitting layer which is/are stacked with the blue light emitting layer.

13. The display panel according to claim 1, wherein the wavelength converting unit comprises one or more selected from the group consisting of an organic fluorescent down-converting material, an organic fluorescent up-converting material, a quantum dot down-converting material and a rare earth up-converting material.

14. The display panel according to claim 1, further comprising:

a transparent scattering unit on the side of the transparent substrate layer away from the thin film transistor layer, wherein the transparent scattering unit is in contact with the transparent substrate layer and is defined by the second pixel defining layer.

15. The display panel according to claim 1, further comprising:

a color film unit on a side of the wavelength converting unit away from the transparent substrate layer.

16. The display panel according to claim 1, wherein an orthogonal projection of the wavelength converting unit on the transparent substrate layer has an area greater than that of an orthogonal projection of the light emitting device on the transparent substrate layer.

17. A method for manufacturing the display panel according to claim 1, comprising:

(i) forming a base film on a temporary base substrate, such that the base film is transparent in a thickness of at least 5 μm from a surface on a side away from the temporary base substrate;

(ii) forming a thin film transistor layer and a light emitting device layer sequentially on a side of the base film away from the temporary base substrate to form a bottom emitting type array substrate;

(iii) peeling off the temporary base substrate to expose a surface of the base film on a side away from the thin film transistor layer;

(iv) etching the exposed surface to form an array of pits, wherein the base film remained at the pits has a thickness of 5 μm or less; and (v) filling the pits with a wavelength converting material to form a wavelength converting unit.

18. The method according to claim 17, wherein, in step (i), the base film is fully transparent; and in step (v), before filling with the wavelength converting material, a reflecting material layer or a light-absorbing material layer is formed on a lateral wall of each of the pits.

19. The method according to claim 17, wherein, the base film comprises an opaque first sub-layer and a transparent second sub-layer, and in step (i), the opaque first sub-layer is firstly formed on the temporary base substrate, and the transparent second sub-layer is then formed on a side of the opaque first sub-layer away from the temporary base substrate.

20. The method according to claim 19, wherein, the opaque first sub-layer is obtained by carbonizing a transparent organic material layer.

* * * * *